United States Patent
Maruyama et al.

(10) Patent No.: US 7,043,686 B1
(45) Date of Patent: May 9, 2006

(54) DATA COMPRESSION APPARATUS, DATABASE SYSTEM, DATA COMMUNICATION SYSTEM, DATA COMPRESSION METHOD, STORAGE MEDIUM AND PROGRAM TRANSMISSION APPARATUS

(75) Inventors: Hiroshi Maruyama, Tokyo (JP); Kento Tamura, Machida (JP); Naohiko Uramoto, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 978 days.

(21) Appl. No.: 09/670,489

(22) Filed: Sep. 26, 2000

(30) Foreign Application Priority Data

Feb. 4, 2000 (JP) .......................... 2000-028359

(51) Int. Cl.
*G06F 15/00* (2006.01)

(52) U.S. Cl. ..................... 715/513; 707/101

(58) Field of Classification Search ............ 715/513, 715/500; 717/143, 144; 707/101

See application file for complete search history.

(56) References Cited

U.S. PATENT DOCUMENTS 5,438,512 A * 8/1995 Mantha et al. ............. 715/517
5,557,720 A * 9/1996 Brown et al. .............. 715/513
5,583,762 A * 12/1996 Shafer ...................... 715/532

(Continued)

FOREIGN PATENT DOCUMENTS

WO    WO 96/17310    * 6/1996

OTHER PUBLICATIONS

De Queiroz, Compression of compound documents, Image Processing vol. 1, IEEE 1999, pp. 209–213.*
Kia et al., Structure–preserving document image compression, Image Processing vol. 1, IEEE 1996, pp. 193–196.*
Kia et al., Structural compression for document analysis, Pattern Recognition vol. 3, IEEE 1996, pp. 664–668.*
European Patent Office Form 1503 for Application No. EP01300387 dated May 30, 2005.
R W Matzen et al., A Formal Language Model for Parsing SGML, J. of Systems and Software, vol. 36, pp. 147–1212 (1997).
J Katajainen et al., Tree Compression and Optimization with Applications, Int. J. of Foundations of Computer Science, vol. 1, No. 4, pp. 425–447 (1990).
J Liefke et al., XMIII: an Efficient Compressor for XML Data, Computer and Information Science of University of Pennsylvania, Technical Report, pp. 1–26.
F. Nack et al., Everything You Wanted to Know about MPEG–7: Part 2, IEEE Multimedia, vol. 6, No. 4, pp. 64–73 (Oct. 1999).

*Primary Examiner*—Cong-Lac Huynh
(74) *Attorney, Agent, or Firm*—Ido Tuchman; Louis Herzberg

(57) ABSTRACT

It is one object of the present invention to perform data compression to encode the structure part of a document in a tree local language, such as XML or ASN.1.

A data compression apparatus for encoding data and for compressing the encoded data comprises: a grammar rule 12 for a tree local language in which data are represented by a labeled tree structure; an encoder 11 for reading a document written in the tree local language, for dividing the document into a structure part and contents, and for encoding the structure part using the grammar rule 12; and a compressor 13 for compressing the contents of the document extracted by the encoder 11, and for encoding the compressed contents.

10 Claims, 12 Drawing Sheets

U.S. PATENT DOCUMENTS

| | | | | |
|---|---|---|---|---|
| 5,630,126 A | * | 5/1997 | Redpath | 707/103 R |
| 5,819,264 A | * | 10/1998 | Palmon et al. | 707/4 |
| 5,915,259 A | * | 6/1999 | Murata | 715/513 |
| 5,933,842 A | * | 8/1999 | Ross | 715/514 |
| 5,999,949 A | * | 12/1999 | Crandall | 715/532 |
| 6,011,905 A | * | 1/2000 | Huttenlocher et al. | 358/1.2 |
| 6,016,467 A | * | 1/2000 | Newsted et al. | 704/9 |
| 6,182,029 B1 | * | 1/2001 | Friedman | 704/9 |
| 6,330,574 B1 | * | 12/2001 | Murashita | 715/513 |
| 6,336,214 B1 | * | 1/2002 | Sundaresan | 717/143 |
| 6,523,172 B1 | * | 2/2003 | Martinez-Guerra et al. | 717/143 |
| 6,635,088 B1 | * | 10/2003 | Hind et al. | 715/513 |
| 6,647,534 B1 | * | 11/2003 | Graham | 715/526 |
| 6,665,665 B1 | * | 12/2003 | Ponte | 707/5 |
| 2002/0120616 A1 | * | 8/2002 | Yun et al. | 707/3 |
| 2004/0013307 A1 | * | 1/2004 | Thienot et al. | 382/232 |

* cited by examiner

```
<?xml version="1.0"?>
<!DOCTYPE department SYSTEM "sample.dtd">
<A>
  <B>
    <D>String1</D>
  </B>
  <C>
    <E>
      <G>String2</G>
    </E>
    <F>
      <G>String3</G>
    </F>
    <E>
      <H>
        <G>String4</G>
      </H>
    </E>
  </C>
</A>
```

```
<?xml version="1.0"?>
<!DOCTYPE department SYSTEM  "sample.dtd">
<A>
  <B>
    <D>□</D>
  </B>
  <C>
    <E>
      <G>□</G>
    </E>
    <F>
      <G>□</G>
    </F>
    <E>
      <H>
        <G>□</G>
      </H>
    </E>
  </C>
</A>
```

Fig. 5

```
<ELEMENT A (B, C)>
<ELEMENT B (D)>
<ELEMENT C (E|F)*>
<ELEMENT E (G|H)>
<ELEMENT F (G)>
<ELEMENT H (G)>
<ELEMENT D (#PCDATA)>
<ELEMENT G (#PCDATA)>
```

| DTD | |
|---|---|
| Before conversion | After conversion |
| `<!ELEMENT department (employee)>`<br>`<!ELEMENT employee (neme, email)>`<br>`<!ATTLIST employee serialNo CDATA #REQUIRED>`<br>`<!ATTLIST employee manager CDATA #IMPLIED>`<br>`<!ELEMENT name (#PCDATA)>`<br>`<!ELEMENT email (#PCDATA)>` | `<!ELEMENT department (employee)>`<br>`<!ELEMENT employee (serialNo, manager?, neme, email)>`<br>`<!ELEMENT serialNo (#PCDATA)>`<br>`<!ELEMENT manager (#PCDATA)>`<br>`<!ELEMENT name (#PCDATA)>`<br>`<!ELEMENT email (#PCDATA)>` |

XML document

| Before conversion | After conversion |
|---|---|
| <department serialNo="012345" manager="yes"><br>　<name>aaaaa</name><br>　<email>mail@address.com</email><br></department> | <department><br>　<serialNo>012345</serialNo><br>　<manager>yes</manager><br>　<name>aaaaa</name><br>　<email>mail@address.com</email><br></department> |

DATA COMPRESSION APPARATUS, DATABASE SYSTEM, DATA COMMUNICATION SYSTEM, DATA COMPRESSION METHOD, STORAGE MEDIUM AND PROGRAM TRANSMISSION APPARATUS

DETAILED DESCRIPTION OF THE INVENTION

1. Field of the Invention

The present invention relates to a data compression method for compressing document data written in a tree local language, such as XML or ASN.1.

2. Background Art

XML (extensible Markup Language) is one of the markup languages used for describing (marking up) the logical structure of a document using simple tags. In XML, grammar rules are regulated and logical definitions are provided for the components of a document, so that a user can uniquely extend the document data. Thus, it is anticipated that in the future XML will be used as a data format for the exchange of data on the Internet.

There is a concept for XML called DTD (Document Type Definition), and whether a document is valid for a specific DTD can be determined. As a specific example, a grammar rule is so regulated that nodes <TITLE>, <AUTHOR> and <PUBLISHER> appear, one time each, in the named order, under a node <BOOK>. And whether a predetermined document is valid, i.e., whether the predetermined document conforms to the grammar rule, can be determined.

As for language style, the structure of an XML document belongs to a class called a tree local language. According to the definition for a tree local language, data are represented by a labeled tree structure, and the correct data for the individual node labels are regulated by the regular language of the labels, of child nodes. That is, in a tree local language, a set of trees that belong to a predetermined grammar (regulated by the DTD in XML) is determined by the regular language that specifies the lists of child nodes of the individual nodes. Another tree local language of this type is ASN.1 (Abstract Syntax Notation 1).

There is an increasing trend for XML to be employed for writing complicated data structures, for business applications and other purposes, that previously could not be written using HTML and other resources available to networks. It is predicted that with this system it will be possible for large XML documents to be exchanged by applications.

Generally, to exchange data or to store it in a database, data files are compressed to reduce their sizes and to increase transmission efficiency. Therefore, many general-purpose data compression techniques, which can be employed for a variety of data format types, and many specialized data compression techniques, which are suitable only for specific data format types, have been proposed and can be employed for the exchange of XML documents. In respect to compression, it should be noted that, while taking into account the data structure of XML documents, there is considerable redundant use of tags, so that high compression ratios can be expected.

PROBLEMS TO BE SOLVED BY THE INVENTION

As is described above, compression of data files is generally performed to facilitate the exchange of data and to store data in databases. With a tree local language, such as XML, high compression ratios can be expected for data portions, such as tags, that represent document structures.

Assume that, for data communication, two parties employ a grammar G in common and guarantee that they will exchange only XML documents that are valid for that grammar. Also assume that the grammar rules are so is regulated that the nodes <TITLE>, <AUTHOR> and <PUBLISHER> appear, one time each, in the named order, under the node <BOOK>. In this case, when the recipient of an XML document detects, for example, a tag <BOOK> in the XML document, the recipient can predict that the first child node will be <TITLE>. Therefore, based on this assumption, the tag <TITLE> becomes redundant, and a method for encoding the XML document to optimize the message length can be devised. This applies not only to XML, but also to arbitrary tree local languages (e.g., ASN.1).

However, conventionally, no compression method has been proposed that uses compression to encode the structure part of a document in a tree local language.

It is, therefore, one object of the present invention to employ data compression to encode the structure parts of documents in tree local languages, such as XML or ASN.1.

It is another object of the present invention to provide for a tree local language a specialized data compression method that is employed with another general-purpose data compression technique, so that a high compression ratio can be realized.

SUMMARY OF THE INVENTION

To achieve the above objects, according to the present invention, a data compression apparatus for encoding data and for compressing the encoded data comprises: a grammar storage unit for storing grammar rules for a tree local language in which data are represented by a labeled tree structure; an encoder for reading a document written in the tree local language, for dividing the document into a structure part and contents, and for encoding the structure part using the grammar rules stored in the grammar storage unit; and a compressor for compressing the contents of the document extracted by the encoder and for encoding the compressed contents. The tree local language is a tree language in which data are represented by a labeled tree structure, and in which, relative to the individual node labels, correct data are regulated using the regular language used for the child node labels.

The encoder includes: a divider for dividing a target document into a structure part and contents; an automata constructor, for constructing pushdown automata that correspond to the grammar rules; and an encoded data generator, for employing the pushdown automata that are constructed by the automata constructor to perform syntax analyzation of the structure part of the document that is obtained by the divider, and for generating an encoded data string for the structure part.

The encoded data generator of the encoder assigns symbols to choices resident in the pushdown automata that are constructed by the automata constructor. And the encoded data generator employs the pushdown automata to analyze the structure part of the document written in the tree local language, and outputs, at the location of the selected choices, the symbols that are assigned for the choices, so that the encoded data string for the structure part is generated. With this arrangement, the structure part of a document written using labels, such as tags, can be changed (encoded) into a simple encoded sequence. To analyze the structure part of the document using the pushdown automata, the tree structure of the document is traced in accordance with depth-first searching. That is, instead of using ranks that are equally distant from a parent node, the relationship between nodes along the depth (parental relationship) is employed as a priority to trace the tree for the analyzation.

Furthermore, the compressor performs compression and encoding not only for the contents of the document written in the tree local language, but also for the structure part of the document that is obtained by the encoder. While the compression method used by the compressor is not especially limited, a conventional general-purpose method can be employed. When an encoder obtains a regular data string through the encoding of the structure part of a document, the encoder can employ a general-purpose method, such as PKZIP, to perform compression and encoding for the encoded data string, and a high compression ratio can be expected. Therefore, it is preferable that the encoded data string also be compressed when the contents of the document are compressed.

Also, when the encoded data string of the structure part and the contents of the document are coupled together and the resultant data are compressed, the structure part and the contents form a single file; and for file management, this is preferable.

According to the present invention, a data communication system comprises: a transmission source data processing apparatus for transmitting data across a communication network; and a transmission destination data processing apparatus for receiving the data transmitted across the communication network by the transmission source data processing apparatus, the transmission source data processing apparatus including a first grammar storage unit for storing grammar rules for a tree local language in which data are represented by a labeled tree structure, an encoder for reading a document written in the tree local language, for dividing the document into a structure part and contents, and for encoding the structure part using the grammar rules stored in the first grammar storage unit, a compressor for compressing the contents of the document extracted by the encoder and for encoding the compressed contents, and a transmitter for transmitting the structure part encoded by the encoder and the contents compressed and encoded by the compressor, and the transmission destination data processing apparatus including a receiver for receiving data from the transmission source data processing apparatus, a second grammar storage unit for storing the same grammar rules as the grammar rules stored in the first grammar storage unit of the transmission source data processing apparatus, a decompressor for employing a decompression method, which corresponds to the compression and encoding method used by the compressor of the transmission source data processing apparatus, to decompress data that are received by the receiver and that correspond to the contents of the document, and a decoder for employing the grammar rules stored in the second grammar rule storage unit to decode the data that are received by the receiver and that correspond to the structure part of the document. A superior manner in which to realize the object of this process is for the grammar rules that are prepared to be used in common by the data transmission source and the destination, because for data communication, a high compression ratio can be achieved for a document written in a tree local language, and communication efficiency can be increased. Since for business communication the general rule is for the grammar rules of a tree local language to be used in common, the present invention can be easily introduced.

In addition, according to the present invention, a database system for storing and managing data in a storage unit comprises: a grammar storage unit for storing grammar rules for a tree local language in which data are represented by a labeled tree structure; an encoder for reading a document written in the tree local language, for dividing the document into a structure part and contents, and for encoding the structure part using the grammar rules stored in the grammar storage unit; a compressor for compressing the contents of the document extracted by the encoder and for encoding the compressed contents; and a storage unit for storing the structure part of the document encoded by the encoder, and for storing the contents of the document that are compressed and encoded by the compressor.

The compressor performs compression and encoding not only for the contents of the document written in the tree local language, but also for the structure part of the document that is obtained by the encoder. When the encoded data string for the structure part and the contents of the document are coupled together and the resultant data are compressed, the structure part and the contents form a single file; and for file management, this is preferable.

Further, according to the present invention, a data compression method for encoding data and for compressing the encoded data comprises the steps of: reading a document written in a tree local language in which data are represented by a labeled tree structure, and dividing the document into a structure part and contents; encoding the structure part using the grammar rules for the tree local language; and compressing the contents of the document extracted by the encoder and encoding the compressed contents.

The step of encoding the structure part of the document includes the steps of: constructing pushdown automata that correspond to the grammar rules; assigning symbols to choices resident in the pushdown automata; employing the pushdown automata to analyze the structure part of the document in accordance with the depth-first searching, and to output, at the locations of the choices, the symbols that are assigned to the choices; and outputting a symbol string that is obtained by employing the pushdown automata as encoded data strings of the structure part of the document that is written in the tree local language. With this arrangement, the structure part of a document written using the labels, such as tags, can be changed (encoded) to obtain a simple encoded sequence.

The data compression method further comprises: a step, to be performed before the step of encoding the structure part of the document written in the tree logical language and when an attribute belongs to a node of a target document in the tree local language, of changing the attribute to a child node of an element possessing the attribute so as to convert the grammar rules of the tree local language and the document into a tree structure that is to be processed by the pushdown automata. This arrangement is preferable because the structure part can be encoded using the pushdown automata even when the attribute is included in the target document, such as an XML document.

The data compression method further comprises: a step, to be performed after the step of encoding the structure part of the document, of employing another general-purpose compression and encoding method to further compress and encode the encoded structure part of the document. This arrangement is preferable because a higher compression ratio can be expected.

According to the present invention, provided is a storage medium on which input means of a computer stores a computer-readable program, the program permitting the computer to perform: a process for reading a document written in a tree local language in which data are represented by a labeled tree structure, and for dividing the document into a structure part and contents; a process for encoding the structure part using the grammar rules of the tree local language; and a process for compressing the contents of the document extracted by the encoder and for encoding the compressed contents. With this arrangement, all the information processing apparatuses in which this program is installed can realize a high compression ratio when compressing a document written in the tree local language and can achieve high efficiency in communication and storage.

In addition, according to the present invention, a program transmission apparatus comprises: storage means for storing a program that permits a computer to perform a process for reading a document written in a tree local language in which data are represented by a labeled tree structure, and for dividing the document into a structure part and contents, a process for encoding the structure part using the grammar rules for the tree local language, and a process for compressing the contents of the document extracted by the encoder and for encoding the compressed contents; and transmission means for reading the program from the storage means, and for transmitting the program. With this arrangement, all the information processing apparatuses that have downloaded this program from the program transmission apparatus and installed it can realize a high compression ratio when compressing a document written in the tree local language and can achieve high efficiency in communication and storage.

PREFERRED EMBODIMENT

The preferred embodiment of the present invention will now be described in detail while referring to the accompanying drawings.

FIG. 1 is a diagram for explaining the general arrangement of a document compression system according to the embodiment. In FIG. 1, an encoder 11 divides a target document into a structure part and contents, and encodes the structure part using a grammar rule 12 that is stored in a predetermined storage device. A compressor 13 comprises a structure part encoded by the encoder 11, and the contents of the document. A decompressor 21 decompresses the document compressed by the compressor 13. At the time whereat the document is decompressed by the decompressor 21, the document is separated into the contents and the structure part encoded by the encoder 11. A decoder 23 reconstructs the encoded structure part by using a grammar rule 22 that is stored in a predetermined storage device, and combines the structure part and the contents to reproduce the document.

When the method of the embodiment is employed for data compression for data communication, the encoder 11 and the compressor 13 are provided on the transmission side, and the decompressor 21 and the decoder 23 are provided on the reception side. And when the method of the embodiment is employed to compress a data file to be stored in a database system, in accordance with the data transmission, the encoder 11 functions as the decoder 23, and the compressor 13 functions as the decompressor 21.

An explanation will now be given for an example wherein XML is employed as a target tree local languages, FIG. 2 is a diagram for explaining the data compression processing according to this embodiment. In the data compression processing in FIG. 2, first, a target XML document 201 is read by the encoder 11, and is divided into a structure part 202 and contents 204. The structure % part 202 includes the tree structure, the tag names and the attribute names of the XML document 201, and the contents 204 comprise #PCDATA and the attribute values of the XML document 201. The XML document 201 is divided into the structure part 202 and the contents 204 because generally the structure part 202 and the contents-204 have quite different statistical deviations, and independently compressing the two is efficient.

The structure part 202 obtained by dividing the XML document 201 is encoded by the encoder 11, and for this encoding, the grammar rule 12 is employed. Since in this embodiment the XML document 201 is the target, the grammar rule 12 is regulated by the DTD. This encoding processing will be described in detail later. The obtained encoded data string 203 and the contents 204 are transmitted to the compressor 13.

Finally, the compressor 13 compresses and encodes the encoded data string 203 and the contents 204, and combines the obtained data to generate a compressed XML document 205. For the encoding process, a conventional, well known method, such as LZ77, is employed by the compressor 13. At this time, the compressor 13 is mainly used to perform compression and encoding for the contents 204. However, a general-purpose compression and encoding method, such as PKZIP, can effectively be used for the encoded data string 203. As will be described later, in this embodiment, the encoded data string 203 is output as a numerical sequence. Therefore, if the data is a sequence of comparatively regular numerals, a high compression ratio can be expected. Thus, the compressor 13 can compress and encode the encoded data string 203 with the contents 204. It should be noted, however, that the compression of the encoded data string 203 by the compressor 13 is an arbitrary process. The encoded data string 203 and the contents 204, rather than being compressed by the, compressor 13, may either be simply correlated with each other or be coupled together, and may be exchanged or may be stored in a storage device.

As is described above, in this embodiment, the structure part 202 of the XML document 201 is compressed using the method of this invention, and further, the encoded structure part 202 and contents 204 are compressed using a conventional method. Thus, the data compression method of this embodiment is employed in conjunction with various conventional compression methods.

To decompress the thus compressed XML document 205, the above compression processing is performed invertedly. Specifically, the decompressor 21 decompresses the encoded data string 203 and the contents 204 using a method that corresponds to the compression and encoding method used by the compressor 13. Then, as will be described later in detail, the decoder 23 reconstructs the decompressed encoded data string 203 using the grammar rule 22, which is identical to the grammar rule 12 and which is regulated by the DTD. Then, the XML document 201 is reproduced using the structure part 202, which is obtained during the decoding process, and the contents 204, which are decompressed by the decompressor 21.

A detailed explanation will now be given for the processing, performed according to the embodiment, used to encode the structure part of the XML document. To simplify the explanation, for this processing a target XML document does not include any attributes, and the overall actual body of the XML document are developed. How to handle attributes will be discussed later.

FIG. 3 is a functional block diagram for explaining the arrangement of the encoder 11 that encodes the structure part of the XML document. In FIG. 3, the encoder 11 comprises: a divider 111, for dividing the target XML document 201 into the structure part 202 and the contents 204; an automata constructor 112, for employing the grammar rule 12 to construct pushdown automata that will be described later; and an encoded data string generator 113, for generating the encoded data string 203 for the structure part 202 by employing, as an encoding transducer, the pushdown automata that are constructed by the automata constructor 112.

FIG. 4 is a diagram showing an example target XML document. The contents of the XML document consist of the list of character strings at the portion of a contents model that corresponds to #PCDATA. That is, the contents of the XML document in FIG. 4 are a list consisting of four character strings, "String1," "String2," "String3" and "String4." This list can be represented compactly using, for example, the following byte string in which character strings terminated by a null character are arranged ("¥0" represents a null character).

"String1¥0String2¥0String3¥0String4¥"

This character string is compressed and encoded separately from the structure part, as described above.

The structure part of the XML document in FIG. 4 is shown in FIG. 5. This structure part is obtained by replacing the character strings that correspond to the contents of the XML document in FIG. 4 with place holders (□).

In this embodiment, the divider 111 of the encoder 11 extracts the structure part in FIG. 5 from the XML document shown in FIG. 4, the automata constructor 112 constructs the pushdown automata using grammar rule 12, and the encoded data string generator 113 encodes the structure part using the pushdown automata. FIG. 6 is a diagram showing an example DTD used to regulate the grammar rule 12.

After the divider 111 has performed the division process, in order to perform encoding using the grammar rule 12, the automata constructor 112 constructs the pushdown automata that correspond to the DTD. According to the DTD in FIG. 6, when an element A appears, it means that one each of an element B and an element C will appear in the named order, and the state shifting is thereafter terminated. Similarly, when the element B appears, it means that one element D will appear, and the state shifting is thereafter terminated. When the element C appears, it means that 0 or more elements E or elements F will appear, and the state shifting is thereafter terminated. When the element E appears, it means that one element G or one element H will appear, and the state shifting is thereafter terminated.

FIG. 7 is a diagram showing the natural pushdown automata that correspond to the DTD in FIG. 6. Since non-terminal symbols D and G are obvious rules having only the terminal symbol #PCDATA, they are not shown.

The automata can be constructed, without any ambiguity, for the individual non-terminal symbols of the grammar. Therefore, when the embodiment is applied for data communication, the same pushdown automata can be constructed by employing the DTD that is used in common by the transmission side and the reception side.

Generally, the pushdown automata are used to analyze the syntax of an input string. In this sense, the pushdown automata receive all the symbol strings on the surface layer, i.e., all the strings acquired by arranging one or more #PCDATA (or place holders "□"). However, as the obtained syntax analyzation tree, for example, a node B and a node C must appear in the named order as the children of a node A.

In addition, following the element C, the empty state is shifted to the final state. As is described above, the pushdown automata can be used to determine whether the syntax analyzation tree for the analyzed XML document (e.g., a DOM tree) satisfies the grammar.

An explanation will now be given for the processing performed to examine the grammar using the pushdown automata, while employing the syntax tree in FIG. 8 as an example. In FIG. 8, #PCDATA at each leaf is not shown.

In order to determine whether this syntax tree can be generated by a grammar regulated by the DTD in FIG. 6, it is only necessary for each node of the syntax tree to determine whether a string consisting of its child nodes can be accepted by the automata that correspond to the non-terminal symbol of the node. For example, an element A as it child nodes a string BC. The child nodes are received by the automata that correspond to the non-terminal symbol A (see A in FIG. 7). Therefore, it is found that this portion satisfies the grammar. When all the nodes are traversed (traced according to the depth-first searching) in the same manner in the Preorder by using the corresponding automata, the grammar checking is terminated.

This usage of the pushdown automata for the syntax analyzation tree is called a validity examination in the following explanation. It should be noted that the automata that correspond to each non-terminal symbol used in the above process are the minimum decisive automata, except for the shifting of the ε to the final state.

The automata constructor 112 converts the pushdown automata in FIG. 7 into a transducer that encodes the structure part of the XML document (see FIG. 5), i.e., automata for the analyzation of the syntax of a character string.

In the pushdown automata in FIG. 7, assume that an entry is a string consisting of four #PCDATAs (or place holders "□") and that the analyzation process is initiated while using A as the start symbol. Then, a node A, a node B and a node D are generated in order, and the first #PCDATA is recognized. When a node C is generated, three choices are available: a node E can be generated, a node F can be generated, or the state shifting can be terminated at the node C and returned to the upper node. Numbers 1, 2 and 3 are assigned to the three choices in consonance with the alphabetical order of the labels (label ε is always determined as being the last). Similarly, since the first state of the node E provides two choices, either a node G can be generated or a node H can be generated, numbers 1 and 2 are assigned to these choices. In this embodiment, numbers are assigned to the choices, but the symbols that can be used to identify the choices are not limited to numbers. Arbitrary symbols, such as alphabetical character or signs, may be employed to designate the choices.

FIG. 9 is a diagram showing an encoding transducer that is produced by the conversion of the pushdown automata in FIG. 7.

The encoded data string generator 113 of the encoder 11 operates an encoding transducer that is constructed by the automata constructor 112.

When the validity examination (the application of the rule in the Preorder) is performed, the encoding transducer in FIG. 9 outputs a corresponding choice number. Specifically, in FIG. 9, there are no choices for the rules A, B, F and H, the encoding transducer outputs nothing. However, when the rule C and the rule E are employed, the encoding transducer outputs pertinent numbers. For example, when the validity examination is performed for the syntax tree in FIG. 8, as the encoding transducer traces the tree it outputs the numbers shown in FIG. 10.

Through the above processing, a number string "112123" is obtained, which strictly regulates the movement of the pushdown automata. Therefore, the number string can be employed as the encoded data string of the structure part (FIG. 5) of the XML document in FIG. 4.

The processing for decoding the structure part of the XML document according to the embodiment will now be described.

To decode the XML document, which is encoded through the above processing, only the input/output of the encoding transducer need be inverted. Therefore, the decoder 23 employs the same pushdown automata as in FIG. 7 to generate a decoding transducer, and begins the decoding process. As is described above, since automata can be constructed, without any ambiguity, for each non-terminal symbol of the grammar, if the grammar rule 12 regulated by the DTD is the same as the grammar rule 22, the decoder 23 can construct exactly the same pushdown automata as those in FIG. 7.

FIG. 11 is a diagram showing a decoding transducer that is produced by the conversion of the same pushdown automata as those in FIG. 7. In the decoding transducer in FIG. 11, "i/B" represents the shift that "when an input character string "i" appears, the rule B is called and thereafter the state is shifted to the next." Thus, a number string from the encoder 11 is input, and a corresponding syntax analyzation tree is generated.

When the number string "112123" described above is entered, based on the assignment of the original numbers, the pushdown automata (the decoding transducer) can, without any ambiguity, accept the encoded number string for the XML document. Therefore, the generated syntax analyzation tree is the same as the original syntax analyzation tree in FIG. 8. As a result, the structure part of the XML document can be reproduced.

The handling of attributes will now be described.

In this embodiment, an attribute is converted to a tree structure so that it can be processed by the pushdown automata. Specifically, all the elements (ELEMENTS) having attributes are changed so that the attributes are regarded as child nodes. At this time, the attributes appear in the alphabetical order of their names. The attribute #REQUIRED is arranged unchanged, and the attribute #IMPLIED is arranged with an option "?." Since originally no information is provided for the attribute #FIXED, it is not included in the DTD obtained by the conversion.

FIG. 12 is a diagram showing a comparison of the states of a predetermined DTD obtained before and after the conversion. In FIG. 12, the DTD on the left is converted into the form shown on the right.

For the XML document that includes attributes, the attributes are also converted to elements in accordance with the DTD. FIG. 13 is a diagram showing a comparison of the states of a predetermined XML document before and after the conversion.

After the DTD and the XML document are changed, in the above manner, to the state where no attribute is provided, the encoding and decoding processing described above are performed. It should be noted that the conversion of the DTD may be performed in advance before the pushdown automata are constructed, or may be performed as needed after the pushdown automata have been constructed. In the first case, a new DTD obtained by the conversion is employed to construct the pushdown automata. In the second case, the original DTD (which had attributes) is employed to construct the pushdown automata.

As is described above, according to this embodiment, it is inevitable that both the XML document compression side and the decompression side shall employ the same DTD in common. Therefore, when the data compression method of the embodiment is employed for data communication, the same DTD must be prepared for the transmission side data processing apparatus and the reception side data processing apparatus.

FIG. 14 is a diagram for explaining the configuration of a data communication system that employs the embodiment. In a data processing apparatus 1410 on a transmission side, the encoder 11 receives an XML document from a data processor, and employs a DTD 1411 (corresponding to the grammar rule 12 in FIG. 1) to encode the structure part. The compressor 13 compresses the encoded structure part and the contents, and a transmitter 1412 transmits to a reception side, via a communication network, the resultant XML document produced by the encoding performed by the encoder 11 and the compression performed by the compressor 13 in the data processing apparatus 1420. In the data processing apparatus 1420 on the reception side, a receiver 1422 receives data via the communication network and transmits them to the decompressor 21. At this time, the decompressor 21 decompresses the received data and the contents of the XML document are recovered. The decoder 23 then employs a DTD 1421 (corresponding to the grammar rule 22 in FIG. 1) to decode the encoded data string for the structure part of the data that have been decompressed. The decoder 23 then reassembles the obtained structure part and the contents to reproduce the XML document, and transmits the XML document to a data processor. During this processing, the DTD 1411 in the transmission side data processing apparatus 1410 has the same contents as the DTD 1421 in the reception side data processing apparatus 1420.

When an XML document is exchanged by applications that are employed for business communications, such as during the course of an electronic business transaction, in most cases, by mutual consent, a DTD is established in advance. Therefore, with the assumption that DTDs will be used in common, the embodiment can be applied for business communications.

When the method of this embodiment is employed to compress a data file to be stored by a database system, to decode the structure part of an XML document, the DTD that was used to encode the structure part can be employed unchanged for decoding it, so that whether or not a DTD is used in common does not have to be taken into account. FIG. 15 is a diagram for explaining the configuration of a database system that employs the embodiment. In a database system 1500, an encoder 11 receives an XML document from a data processor, and employs a DTD 1501 (corresponding to the grammar rule 12 in FIG. 1) to encode the structure part. A compressor 13 then compresses the encoded structure part and the contents. After the XML document has been encoded by the encoder 11 and compressed by the compressor 13 it is stored in a storage device 1502. To read the XML document from the storage device 1502, the compressor 13 functions as the decompressor 21 and the encoder 11 functions as the decoder 23, and the DTD 1501 used for encoding the structure part of the XML document is employed for decoding it.

In the above explanation, the XML language is used as the tree local language. However, the embodiment can be employed for another tree local language, such as ASN.1. In this case, however, grammar rules, such as the DTD for XML, must also be used in common by the data file compression side and the decompression side.

ADVANTAGES OF THE INVENTION

As is described above, according to the present invention, data compression can be performed to encode the structure part of a document in a tree local language.

Furthermore, since a data compression method is specially adapted for a tree local language and is employed with another general-purpose data compression technique, a data compression method that provides a high compression ratio can be employed.

BRIEF DESCRIPTION OF THE DRAWINGS

FIG. 5 is a diagram showing the structure part of the XML document in FIG. 4.

FIG. 6 is a diagram showing an example grammar rule used for the embodiment.

FIG. 12 is a diagram for explaining the state wherein a DTD that has attributes is converted into a DTD that has no attributes.

DESCRIPTION OF THE SYMBOLS

Figure 1:
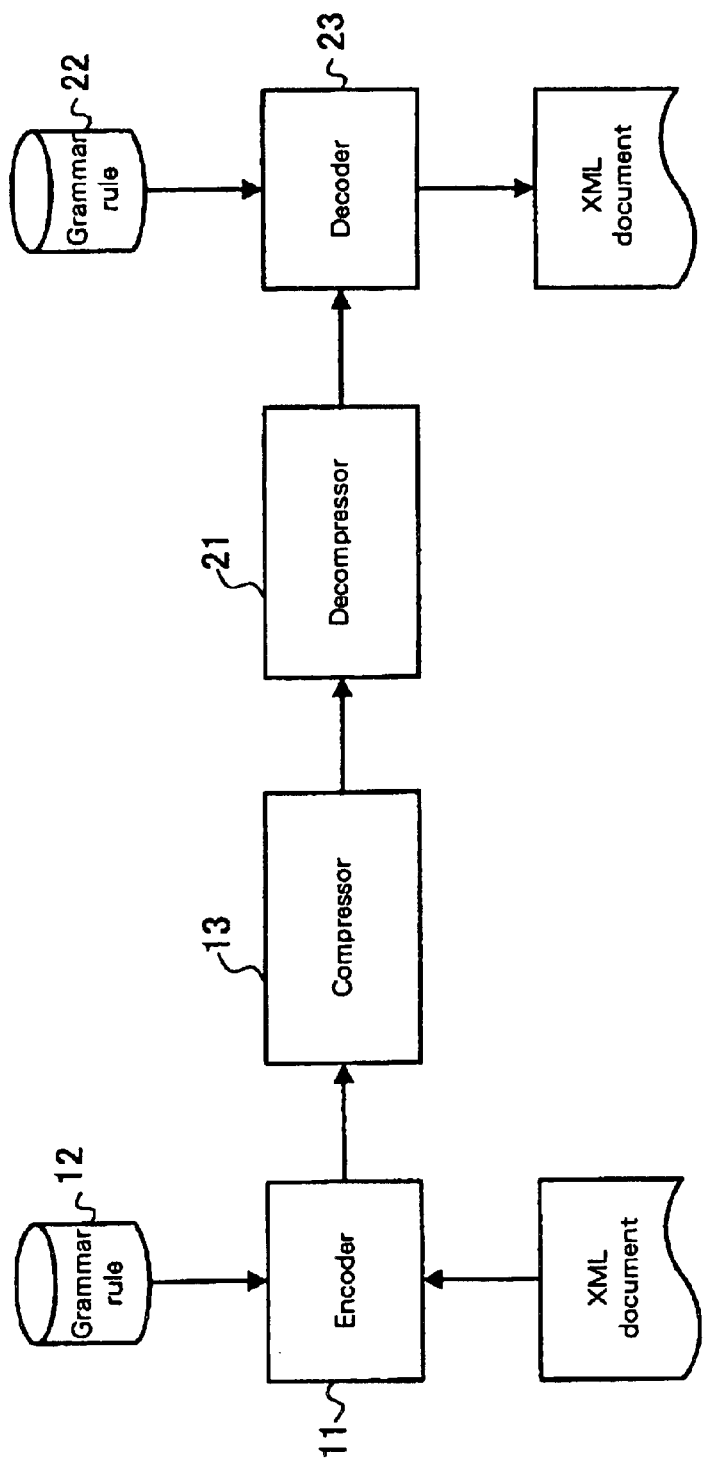
FIG. 1 is a diagram for explaining the general arrangement of a document compression system according to one embodiment of the present invention.
Figure 2:
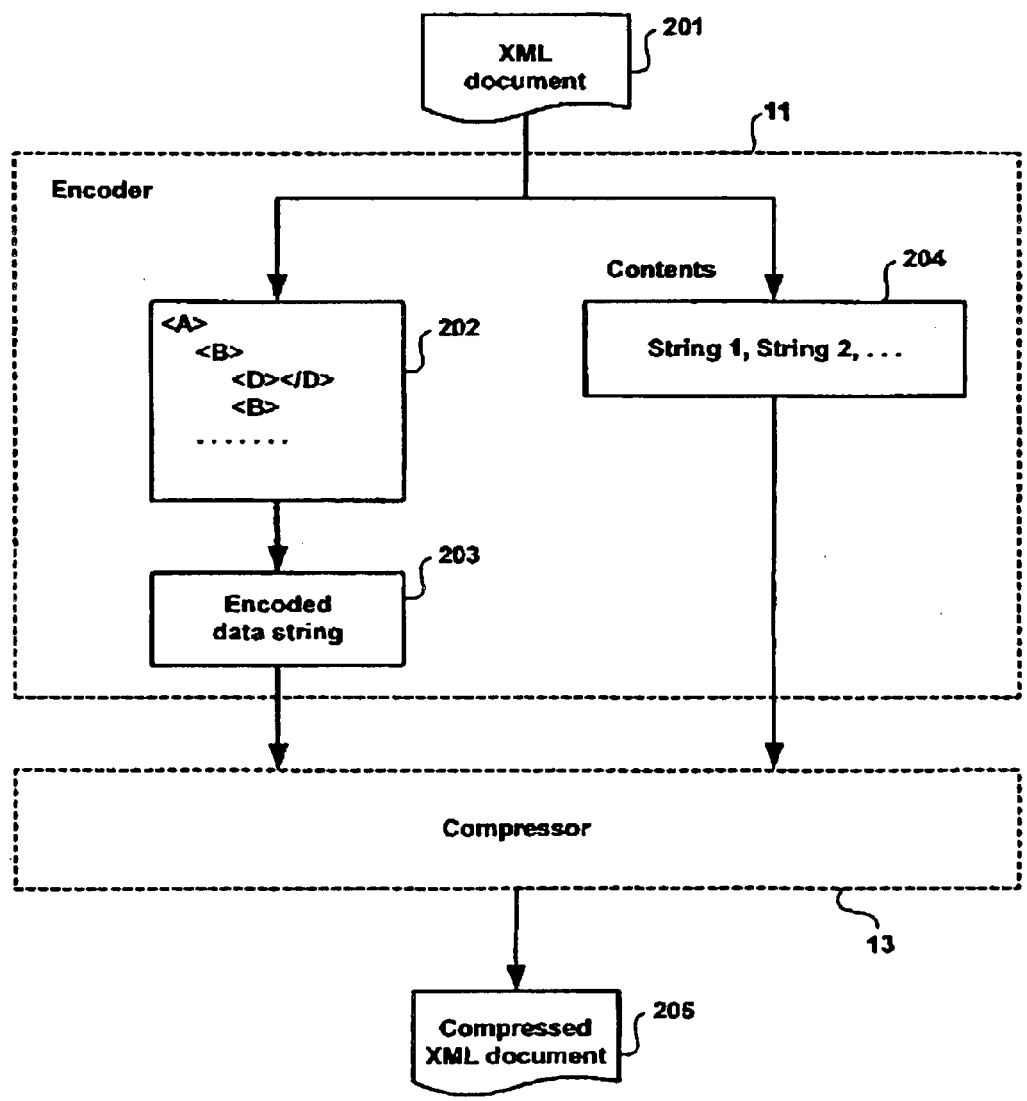
FIG. 2 is a diagram for explaining the data compression processing according to the embodiment.
Figures 3, 4:
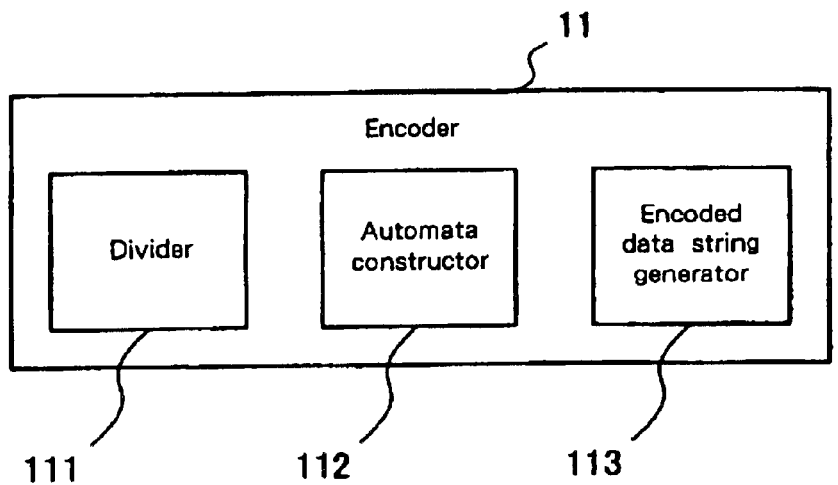
FIG. 3 is a diagram for explaining the arrangement of an encoder according to the embodiment.
FIG. 4 is a diagram showing an example target XML document according to the embodiment.
Figure 7:
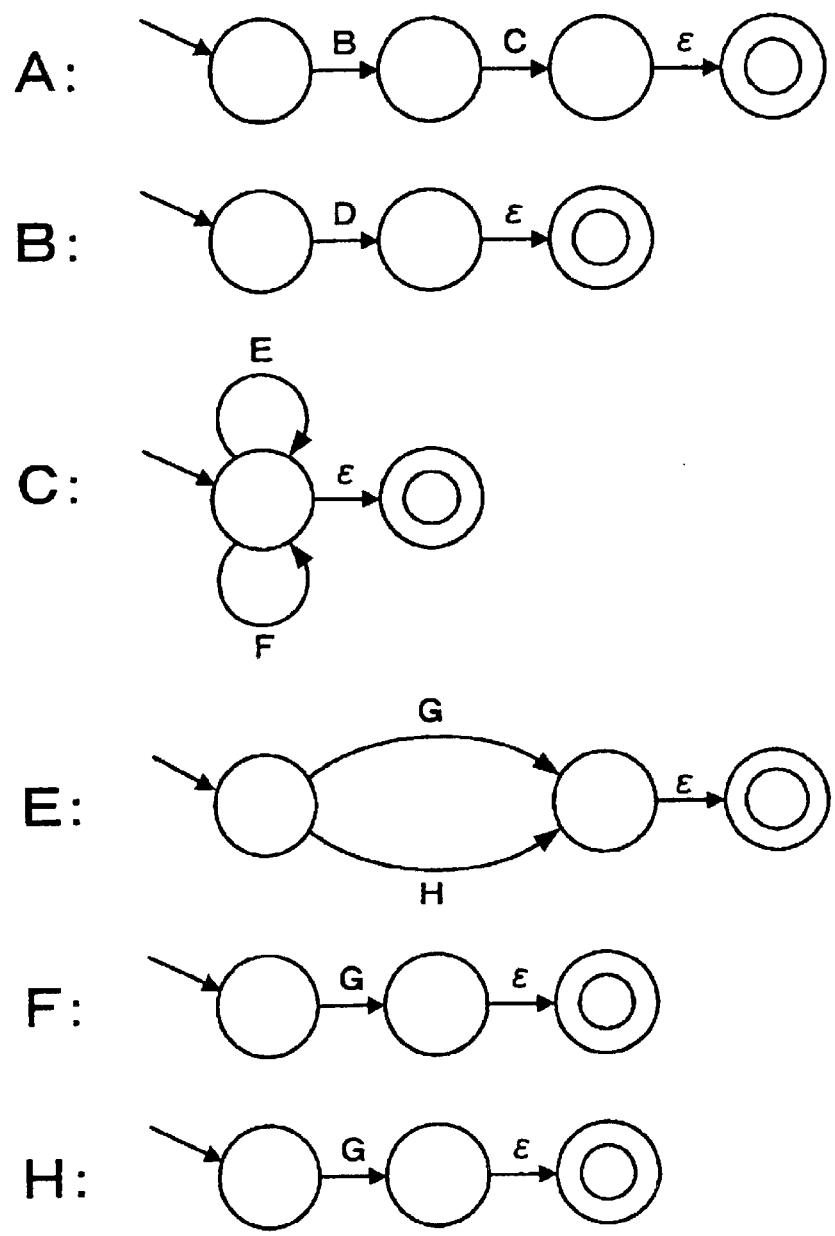
FIG. 7 is a diagram showing pushdown automata that are constructed in accordance with the grammar rule in FIG. 6.
Figure 8:
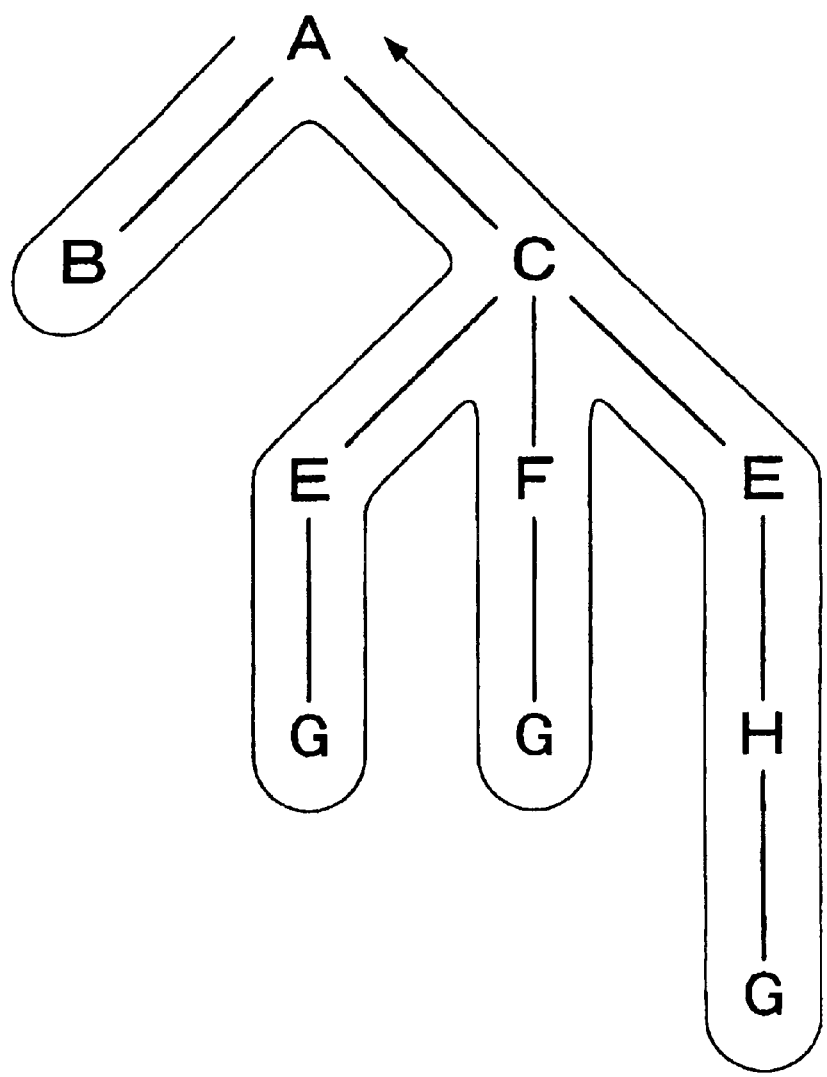
FIG. 8 is a diagram showing an example syntax tree for explaining the grammar checking method that uses the pushdown automata.
Figure 9:
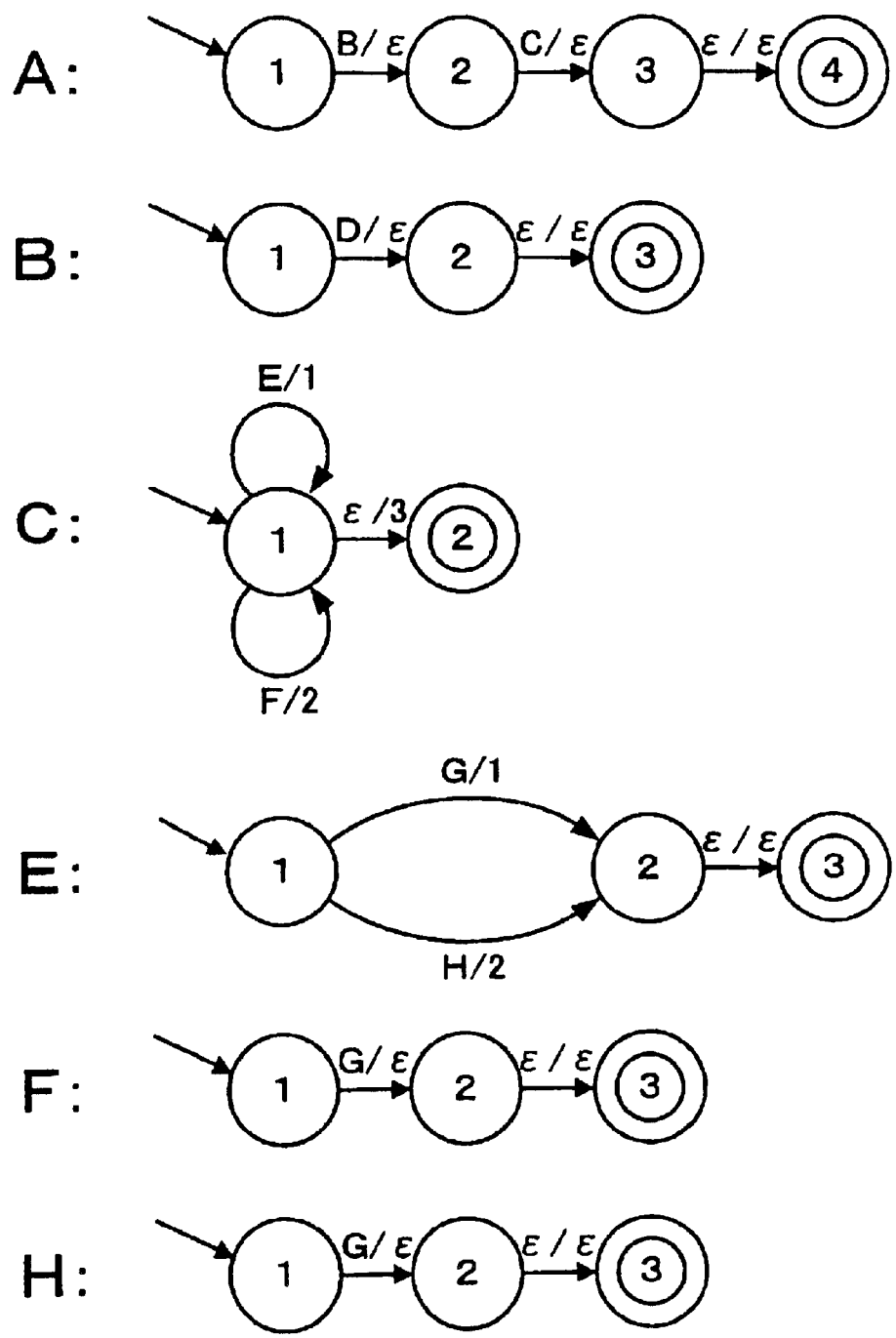
FIG. 9 is a diagram showing an encoding transducer that is generated by using the pushdown automata in FIG. 7.
Figure 10:
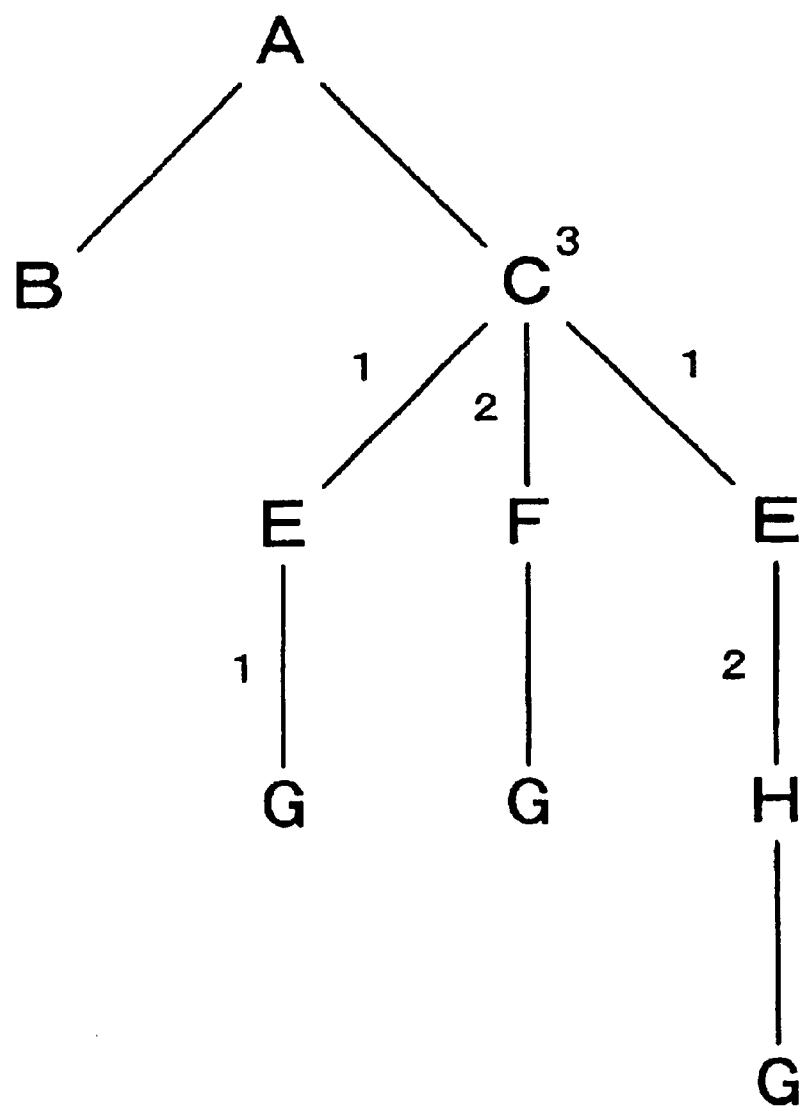
FIG. 10 is a diagram showing example results obtained by a validity examination performed for the syntax tree in FIG. 8.
Figure 11:
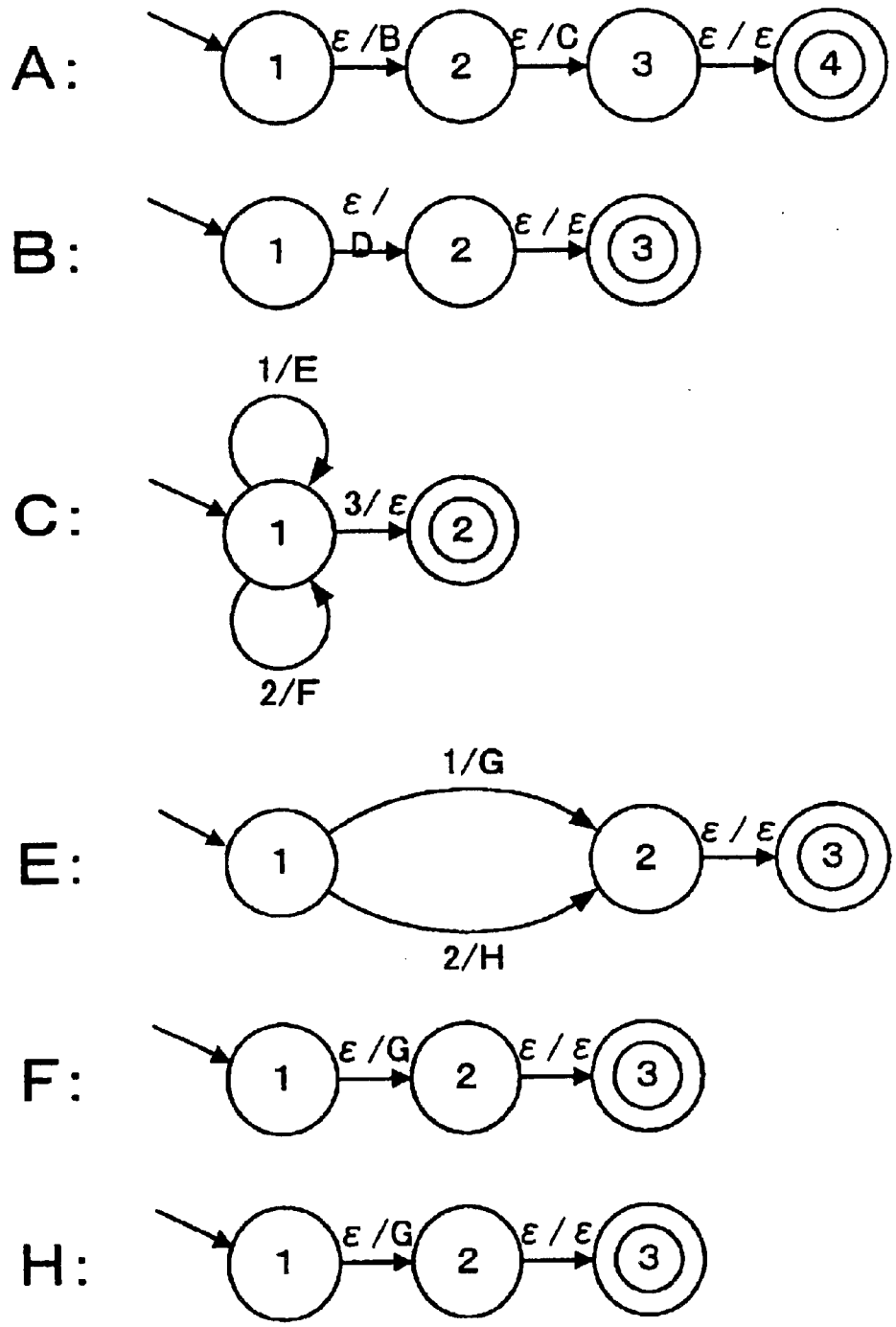
FIG. 11 is a diagram showing a decoding transducer that is generated by using the same pushdown automata as in FIG. 7.
Figures 13, 14:
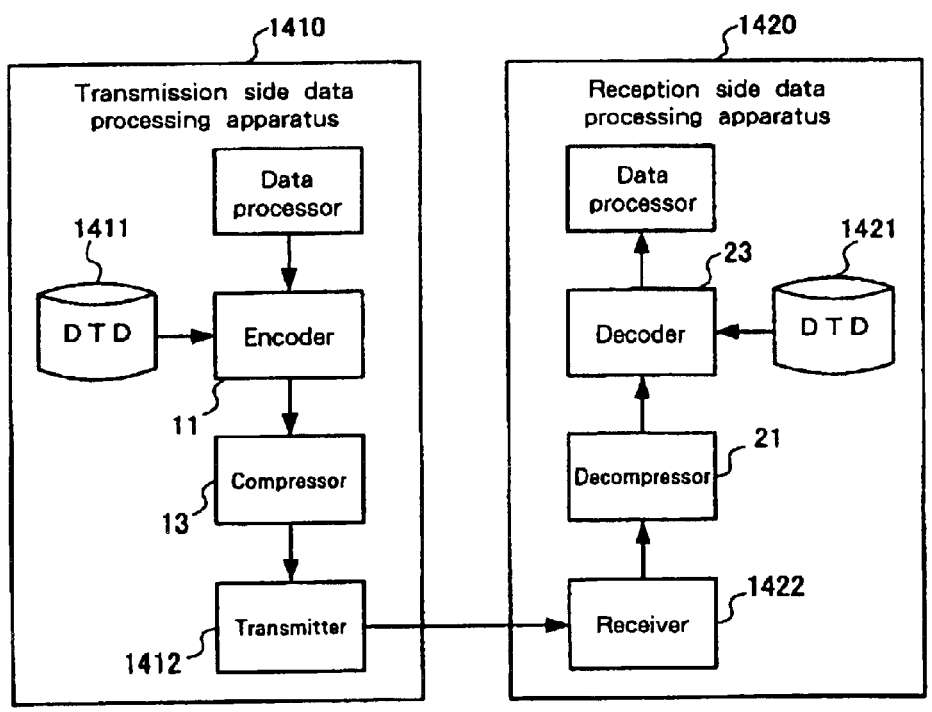
FIG. 13 is a diagram for explaining the state wherein an XML document that has attributes is converted into an XML document that has no attributes.
FIG. 14 is a diagram for explaining the structure when the embodiment is applied for a data communication system.
Figure 15:
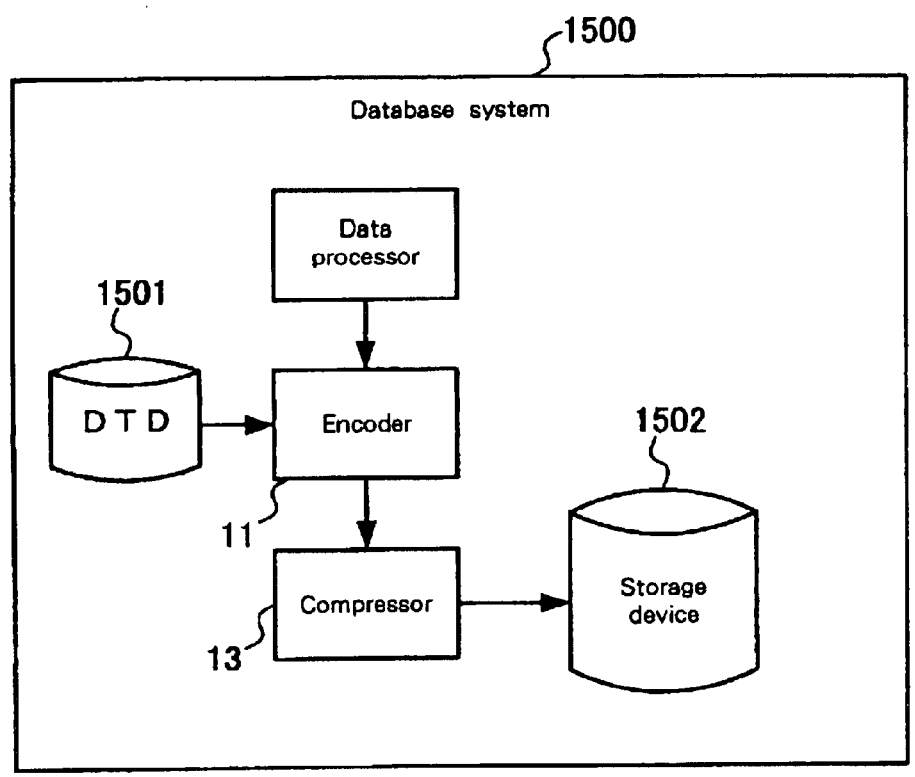
FIG. 15 is a diagram for explaining the structure when the embodiment is applied for a database system.

11: Encoder
12, 22: Grammar rule
13: Compressor
21: Decompressor
23: Decoder
201: XML document
202: Structure part
203: Encoded data string
204: Contents
205: Compressed XML document

What is claimed is:

1. A data compression apparatus for encoding data and for compressing the encoded data comprising:
   a grammar storage unit for storing grammar rules for a tree local language in which data are represented by a labeled tree structure;
   an encoder for reading a document written in said tree local language, for dividing said document into a structure part and contents, and for encoding said structure part using said grammar rules stored in said grammar storage unit; and
   a compressor for compressing said contents of said document extracted by said encoder; and
   wherein said encoder includes;
   a divider for dividing a target document into a structure part and contents;
   an automata constructor, for constructing pushdown automata that correspond to said grammar rules; and
   an encoded data generator, for employing said pushdown automata that are constructed by said automata constructor to perform syntax analysis of said structure part of said document that is obtained by said divider, and for generating an encoded data string for said structure part.

2. That data compression apparatus according to claim 1, wherein said encoded data generator of said encoder assigns symbols to choices resident in said pushdown automata that are constructed by said automata constructor; and wherein said encoded data generator employs said pushdown automata to analyze said structure part of said document written in said tree local language, and outputs, at the location of the selected choices, said symbols that are assigned for said choices, so that the encoded data string for said structure part is generated.

3. The data compression apparatus according to claim 1, wherein said compressor performs compression and encoding not only for said contents of said document written in said tree local language, but also for said structure part of said document that is obtained by said encoder.

4. A database system for storing and managing data in a storage unit comprising:
   a grammar storage unit for storing grammar rules for a tree local language in which data are represented by a labeled tree structure;
   an encoder for reading a document written in said tree local language, for dividing said document into a structure part and contents, and for encoding said structure part using said grammar rules stored in said grammar storage unit;
   a compressor for compressing said contents of said document extracted by said encoder and for encoding the compressed contents; and
   a storage unit for storing said structure part of said document encoded by said encoder, and for storing said contents of said document that are compressed and encoded by said compressor; and
   wherein said encoder includes:
   a divider for dividing said document into said structure part and contents;
   an automata constructor, for constructing pushdown automata that correspond to said grammar rules; and
   an encoded data generator, for employing said pushdown automata that are constructed by said automata constructor to perform syntax analyzation of said structure part of said document that is obtained by said divider, and for generating an encoded data string for said structure part.

5. The database system according to claim 4, wherein said compressor performs compression and encoding not only for said contents of said document written in said tree local language, but also for said structure part of said document that is obtained by said encoder.

6. A data compression method for encoding data and for compressing the encoded data comprising the steps of:

reading a document written in a tree local language in which data are represented by a labeled tree structure, and dividing said document into a structure part and contents;

encoding said structure part using grammar rules for said tree local language; and compressing said contents of said document extracted by said encoder; and wherein said step of encoding said structure part of said document includes the steps of:

constructing pushdown automata that correspond to said grammar rules;

assigning symbols to choices resident in said pushdown automata;

employing said pushdown automata to analyze said structure part of said document in accordance with the depth-first searching, and to output, at the locations of said choices, said symbols that are assigned to said choices; and outputting a symbol string that is obtained by employing said pushdown automata as encoded data strings of said structure part of said document that is written in said tree local language.

7. The data compression method according to claim 6, further comprising:

a step, to be performed before said step of encoding said structure part of said document written in said tree local language and when an attribute belongs to a node of a target document in said tree local language, of changing said attribute to a child node of an element possessing said attribute so as to convert said grammar rules of said tree local language and said document into a tree structure that is to be processed by said pushdown automata.

8. The data compression method according to claim 6, further comprising: a step, to be performed after said step of encoding said structure part of said document, of employing another general-purpose compression method to further compress said encoded structure part of said document.

9. A storage medium on which input means of a computer stores a computer-readable program, said program permitting said computer to perform:

a process for reading a document written in a tree local language in which data are represented by a labeled tree structure, and for dividing said document into a structure part and contents;

a process for encoding said structure part using said grammar rules of said tree local language; and a process for compressing said contents of said document extracted by said encoder; and wherein the process for encoding said structure part includes:

an automatic constructing process, for constructing pushdown automata that correspond to said grammar rules; and an encoded data generator process for employing said pushdown automata that are constructed by said automata constructing process to perform syntax analyzation of said structure part of said document and for generating an encoded data string for said structure part.

10. A program transmission apparatus comprising:

storage means for storing a program that permits a computer to perform a process for reading a document written in a tree local language in which data are represented by a labeled tree structure, and for dividing said document into a structure part and contents, a process for encoding said structure part using said grammar rules for said tree local language, and a process for compressing said contents of said document extracted by said encoder; and transmission means for reading said program from said storage means, and for transmitting said program; and wherein the process for encoding said structure part includes:

an automata constructing process, for constructing pushdown automata that correspond to said grammar rules; and an encoded data generator process for employing said pushdown automata that are constructed by said automata constructing process to perform syntax analyzation of said structure part of said document and for generating an encoded data string for said structure part.

* * * * *

UNITED STATES PATENT AND TRADEMARK OFFICE
CERTIFICATE OF CORRECTION

| | |
|---|---|
| PATENT NO. | : 7,043,686 B1 |
| APPLICATION NO. | : 09/670489 |
| DATED | : May 9, 2006 |
| INVENTOR(S) | : Hiroshi Maruyama et al. |

It is certified that error appears in the above-identified patent and that said Letters Patent is hereby corrected as shown below:

Column 14, Line 9, Claim 9, "automatic" should be --automata--.

Signed and Sealed this

Twentieth Day of March, 2007

JON W. DUDAS
*Director of the United States Patent and Trademark Office*